United States Patent [19]
Yang et al.

[11] Patent Number: 5,387,539
[45] Date of Patent: Feb. 7, 1995

[54] METHOD OF MANUFACTURING TRENCH ISOLATION

[75] Inventors: Hong S. Yang, Ichonkun; Sung K. Kwon, Seodaimunku, both of Rep. of Korea

[73] Assignee: Hyundai Electronics Industries Co., Ltd., Ichonkun, Rep. of Korea

[21] Appl. No.: 79,673

[22] Filed: Jun. 18, 1993

[30] Foreign Application Priority Data

Jun. 18, 1992 [KR] Rep. of Korea ............... 1992-10558

[51] Int. Cl.[6] .................. H01L 21/302; H01L 21/76
[52] U.S. Cl. ..................................... 437/67; 437/228
[58] Field of Search ........................... 437/67, 228; 148/DIG. 50, 85, 86

[56] References Cited

U.S. PATENT DOCUMENTS 5,190,889  2/1994  Poon et al. .................... 437/67

FOREIGN PATENT DOCUMENTS

| 58-223346 | 12/1983 | Japan | 437/67 |
| 59-191351 | 10/1984 | Japan | 437/67 |
| 61-256649 | 11/1986 | Japan | 437/67 |
| 63-112831 | 6/1988 | Japan | 437/67 |
| 63-144540 | 6/1988 | Japan | 437/67 |
| 216752 | 1/1990 | Japan | 437/67 |

*Primary Examiner*—George Fourson
*Assistant Examiner*—S. Mulpuri
*Attorney, Agent, or Firm*—Darby & Darby

[57] ABSTRACT

A method of manufacturing a trench isolation comprising the steps of sequentially forming a first oxide layer a nitride layer and a first photoresist layer, forming a narrow trench and a wide trench, forming a first thermal oxide layer in the side and bottom face of trenches, forming a second oxide layer, depositing a first polysilicon oxide layer filling in the narrow trench by growing the first polysilicon layer growing into a second silicon layer, forming a third oxide layer, coating a second photoresist on the wide trench, and etching a third oxide layer. The present invention can provide a method of manufacturing a trench isolation which can prevent formation of voids in the narrow trench and the difference of height between narrow trench and wide trench, thereby preventing a conducting line short circuit and an increase of parasitic capacitance and a fall of the characteristic of the MOS transistor.

4 Claims, 6 Drawing Sheets

METHOD OF MANUFACTURING TRENCH ISOLATION

BACKGROUND OF THE INVENTION

The present invention relates to a method of manufacturing a trench isolation, more specially to a method of manufacturing a trench isolation which can prevent formation of void in narrow trench and the difference of height between narrow trench and wide trench, thereby preventing a short of conducting line and an increase of a parasitic capacity and a fall of characteristic of MOS transistor.

A method of manufacturing a trench isolation is generally composed of steps which a trench is formed in a semiconductor substrate, thereafter CVD oxide layer is deposited on a trench and an upper side of a semiconductor substrate, thereafter the entire structure is flatly covered by a photoresist, thereafter a photoresist and a CVD oxide layer is etched on condition that the photoresist/CVD oxide layer etch ratio is 1 and CVD oxide layer only remains in a trench.

FIGS. 1A to 1D show steps in manufacturing a conventional trench isolation.

Referring to FIG. 1A, the 1st oxide layer 21 and nitride layer 22 and the 1st photoresist 23 are sequentially formed on the silicon substrate 1, thereafter the pattern of the 1st photoresist 23 is formed by eliminating an intended part of the 1st photoresist 23, and the 1st oxide layer 21 and nitride layer 22 of the eliminated part of the first photoresist 23 is etched. Continuously narrow trench 10 and wide trench 10' is formed by etching silicon substrate 1.

Referring to FIG. 1B, the 1st thermal oxide layer 24 is formed on the side and bottom wall of trench 10,10', thereafter the 2nd oxide layer 25 is thickly formed on the entire structure.

It is noticeable that an etch ratio increase in case of wet etching because the void is formed at the central part of the 2nd layer 25.

Referring to FIG. 1C, the second photoresist 26 is flatly coated on the entire structure. Referring to FIG. 1D, the second photoresist 26 and the 2nd oxide layer 25 is etched until the nitride layer 22 is exposed on condition that the 2nd photoresist/the 2nd oxide layer etch ratio is 1. Thereafter, a trench isolation 25A including the 2nd oxide layer 25 is formed by eliminating the nitride 22 and the 1st oxide layer 21 in $HNO_3$ or hot $H_3PO_4$ solution. A void is formed in narrow trench isolation 25A when an etch back process and a wet etch is performed and a topology having a length of "d" is formed in a wide trench isolation 25B.

In the conventional method as described above, problems are as follows:

First, the possibility is high which a conducting line is short because of a void. Second, the characteristic of MOS-transistor falls since the difference of height is formed between a wide trench isolation and a narrow trench isolation.

Third, a device does not have high speed since a parasitic capacity increases. As disclosed in Japanese application No. sho 62-289954 for the purpose of solving problems of conventional method, a method of manufacturing a trench isolation has been proposed.

Referring to FIGS. 2A to 2F, a method of manufacturing of Japanese application is described as follows.

Referring FIG. 2A, mask layer 1b and the first resist layer 1c is formed on the silicon substrate 1a, thereafter the pattern is formed as an intended size. Referring FIG. 2B, narrow trench and wide trench are formed on the silicon substrate 1a, thereafter, resist layer 1c is eliminated. Referring FIG. 2C, the 1st thermal oxide layer 5 and polysilicon layer 7 are sequentially formed on the silicon substrate 1a after said mask layer 1b is eliminated.

Referring FIG. 2D, as polysilicon layer 7 is oxidized by heat, a groove of narrow trench 10 and wide trench 10' is filled because of volume increase. Therefore, the inner part of trench 10, 10' is filled in the 2nd thermal oxide layer 7'.

Referring FIG. 2E, resist 1d is flatly coated by spin on the entire structure. Referring FIG. 2F, resist 1d and the 2nd thermal oxide layer 7' is etched by reactive ion which resist 1d/the 2nd thermal oxide layer 7' etch ratio is approximately 1.

However, a conventional method of manufacturing a trench isolation can prevent formation of void in narrow trench, but cannot prevent formation of the difference of height between narrow trench and wide trench by over etching wide trench.

SUMMARY OF THE INVENTION

An object of the present invention is to provide a method of manufacturing a trench isolation which can prevent the formation of void in narrow trench and the difference of height between narrow trench and wide trench, thereby preventing a short of conducting line and an increase of a parasitic capacity and a fall of characteristic of MOS transistor.

According to an embodiment of the present invention, there is provided a method of manufacturing a trench isolation, comprising the steps of forming the pattern of the 1st oxide layer and nitride layer and the 1st photoresist layer sequentially and eliminating the 2nd polysilicon layer and the 2nd photoresist, flatly coating the 3rd photoresist or BPSG on the entire structure, and etching the 3rd photoresist or BPSG, etching oxide layer until exposing the 2nd polysilicon layer and nitride layer, and eliminating the 2nd polysilicon layer of wide trench and nitride layer, and forming trenches including the 1st thermal oxide layer and the 2nd oxide layer and the 2nd thermal oxide layer.

DETAILED DESCRIPTION OF THE INVENTION

Figure 1A:
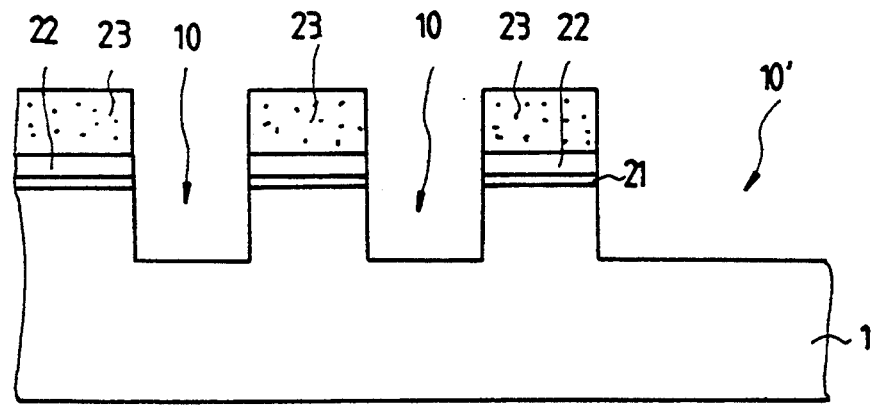
FIGS. 1A to 1D are cross sectional views showing a convention method of manufacturing a trench isolation.
Figure 1B:
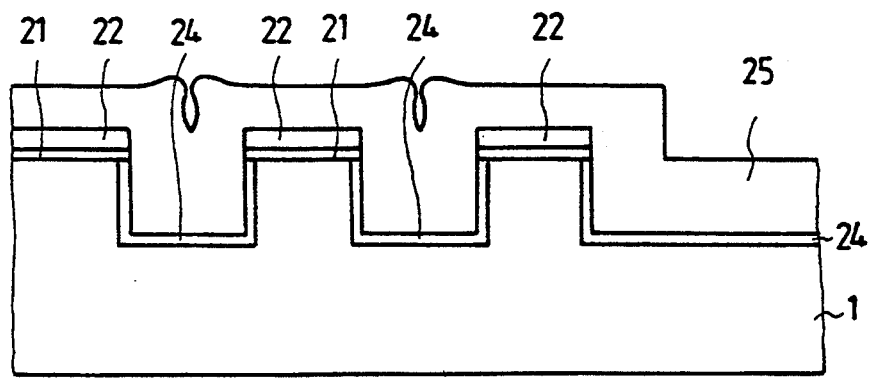
Figure 1C:
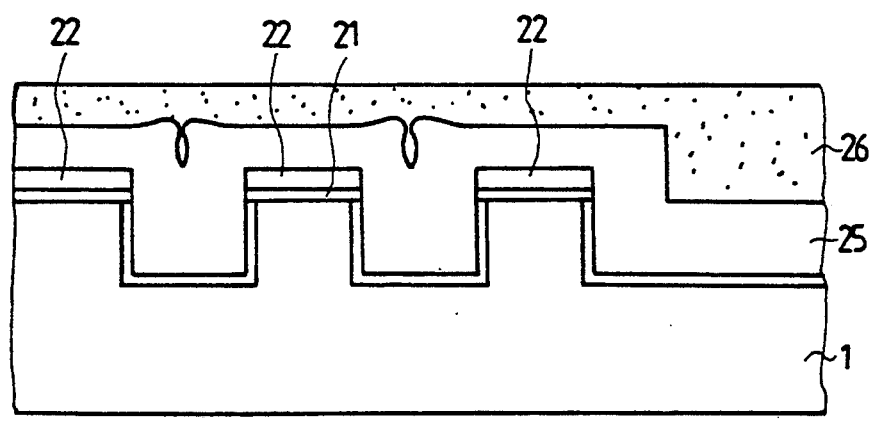
Figure 1D:
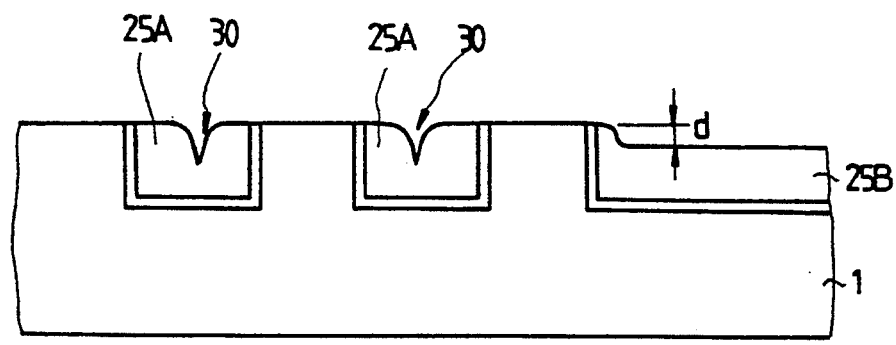
Figure 2A:
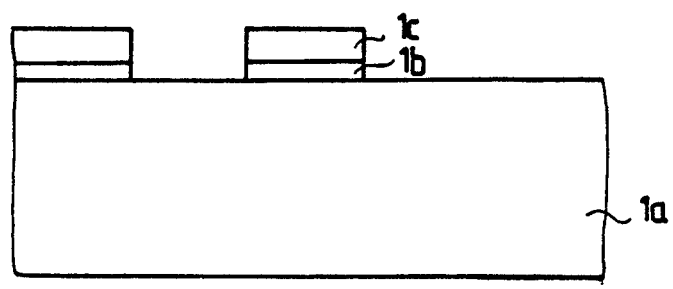
FIGS. 2A to 2F are cross sectional views showing another conventional method of manufacturing a trench isolation.
Figure 2B:
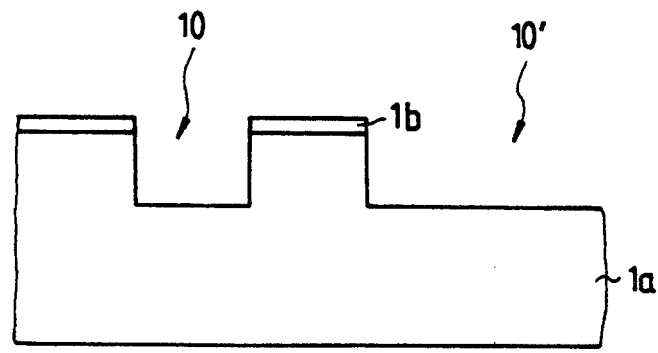
Figure 2C:
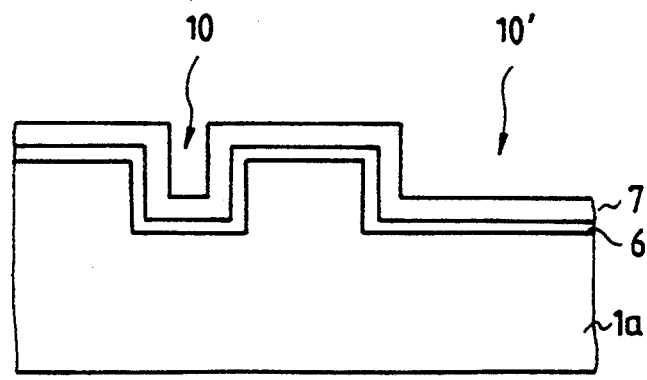
Figure 2D:
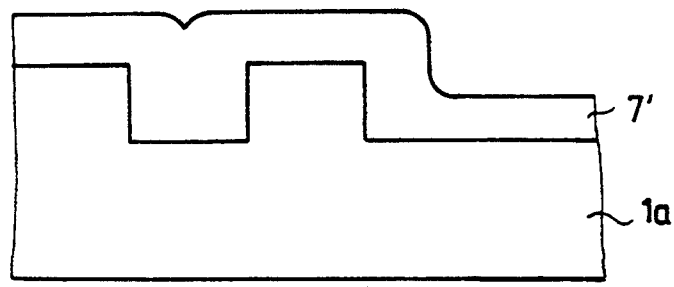
Figure 2E:
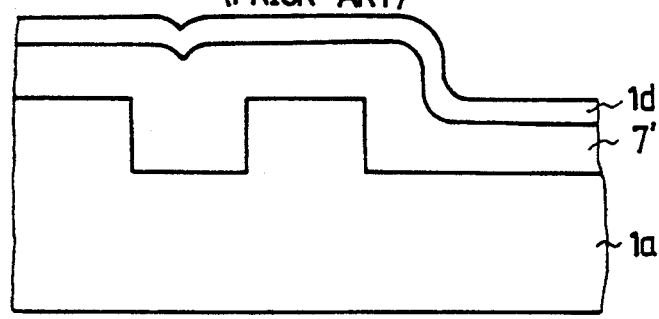
Figure 2F:
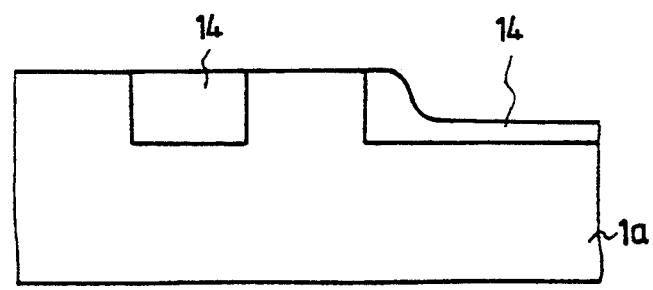
Figure 3A:
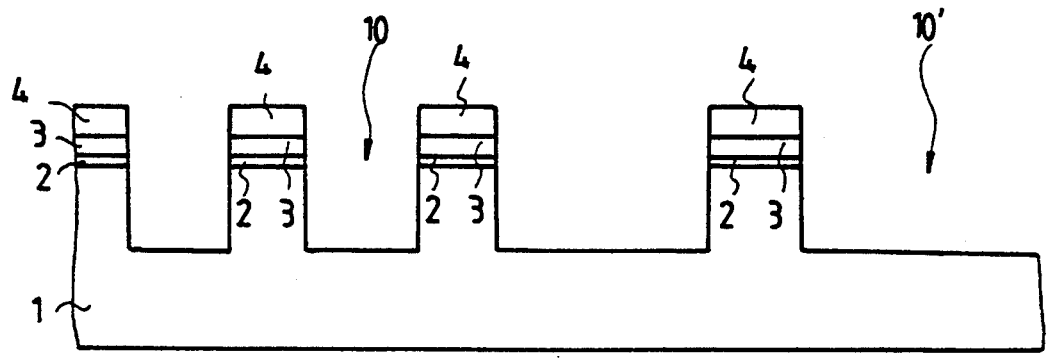
FIGS. 3A to 3G are cross sectional views showing a method of manufacturing a trench isolation according to an embodiment of the present invention.

Referring to FIGS. 3A to 3G, the present invention is described as follows. Referring to FIG. 3A, the pattern of the 1st oxide layer 2, nitride layer 3, the 1st photoresist 4 is formed on the silicon substrate 1, thereafter, narrow trench 10 and wide trench 10' having a depth of 0.4–0.6 μm is formed by etching the silicon substrate 1.

Figure 3B:
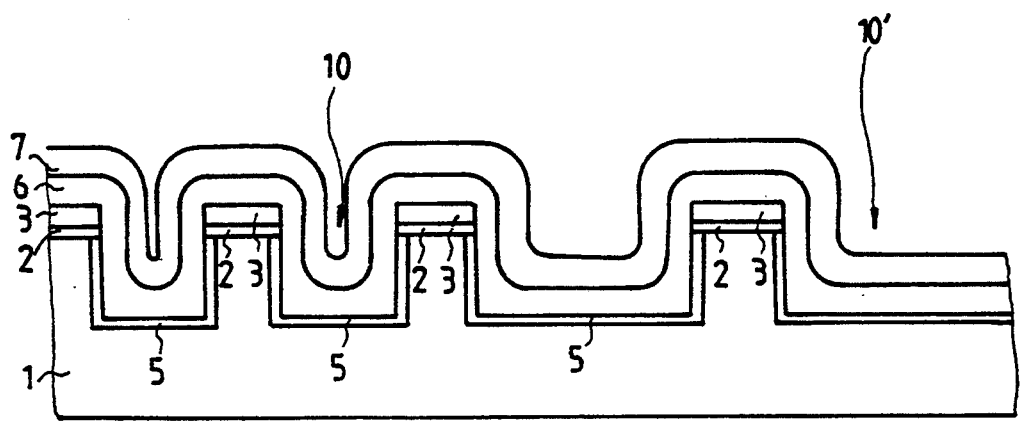

Referring FIG. 3B, the pattern of the 1st photoresist 4 is eliminated, and the 1st thermal oxide layer 5 is formed on the side and bottom face of trench 10, 10', thereafter, the 2nd oxide layer 6, for example TEOS(tetraethoxysilane), MTD(Medium Temperature Oxide), HTO(High Temperature Oxide), is deposited with 3000–4000Å on the entire structure. Thereafter, the 1st polysilicon layer 7 is deposited with 500–1000Å on the entire structure.

Figure 3C:
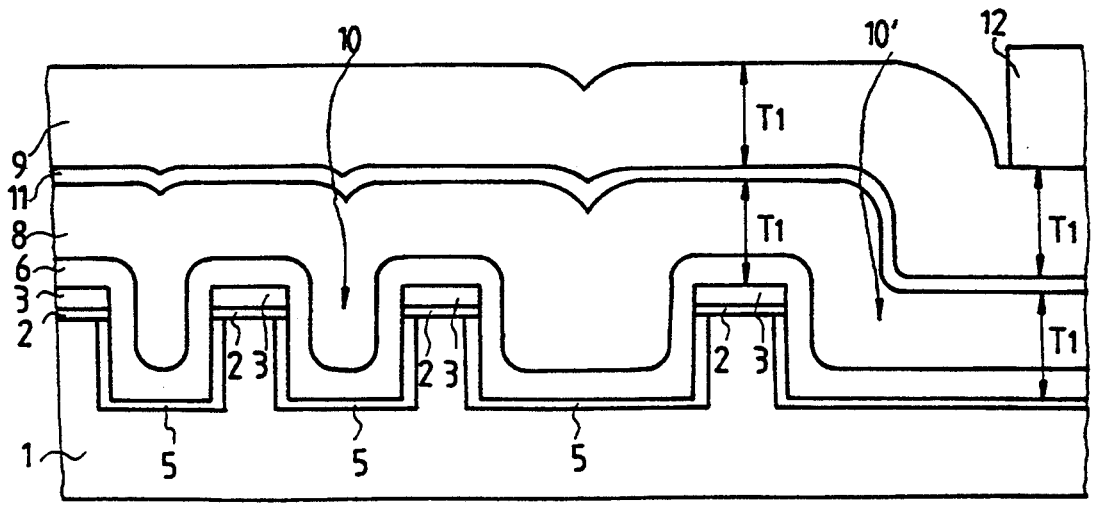

Referring FIG. 3C, the 2nd thermal oxide layer 8 is formed by oxidizing the 1st polysilicon layer 7 at temperature 850°–950° C., thereafter, the 2nd polysilicon layer 11 is deposited with 500–1000Å on the entire structure. Thereafter, the 3rd oxide layer 9 on the entire structure is deposited with the thickness T1, that is, from nitride layer 3 to the 2nd thermal oxide layer 8, and the 2nd photoresist 12 is coated on wide trench 10'. The formation of densifying the 2nd thermal oxide layer 8 according to oxidizing the 1st polysilicon layer 7 settles a problem that a void is formed at the central part of narrow trench 10 by wet etching.

Figure 3D:
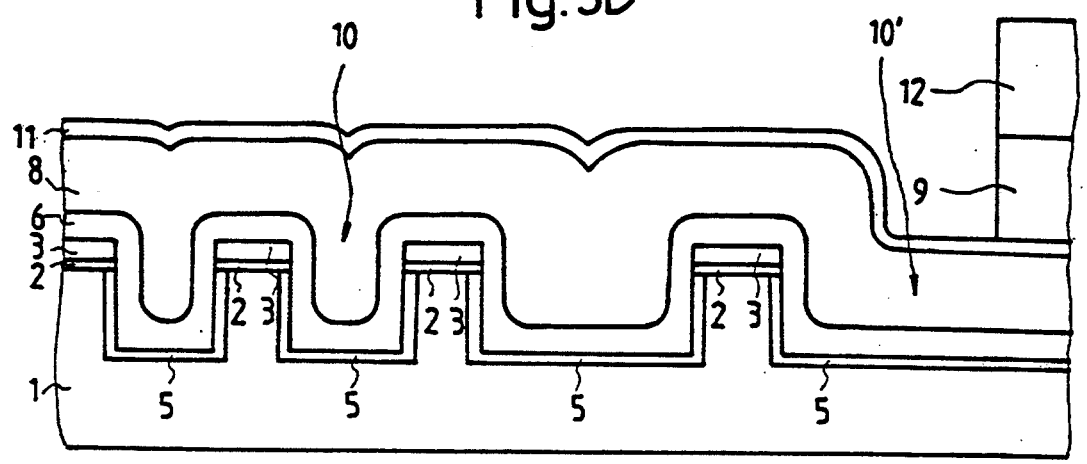

Referring to FIG. 3D, the 3rd oxide layer 9 is etched by using the 2nd photoresist 12 as etch barrier in order to optionally leave the 2nd polysilicon layer 11 on wide trench 10' the 3rd oxide layer 9 is perfectly eliminated by overetching since the 3rd oxide layer/the 2nd polysilicon layer etch ratio is over 40.

Figure 3E:
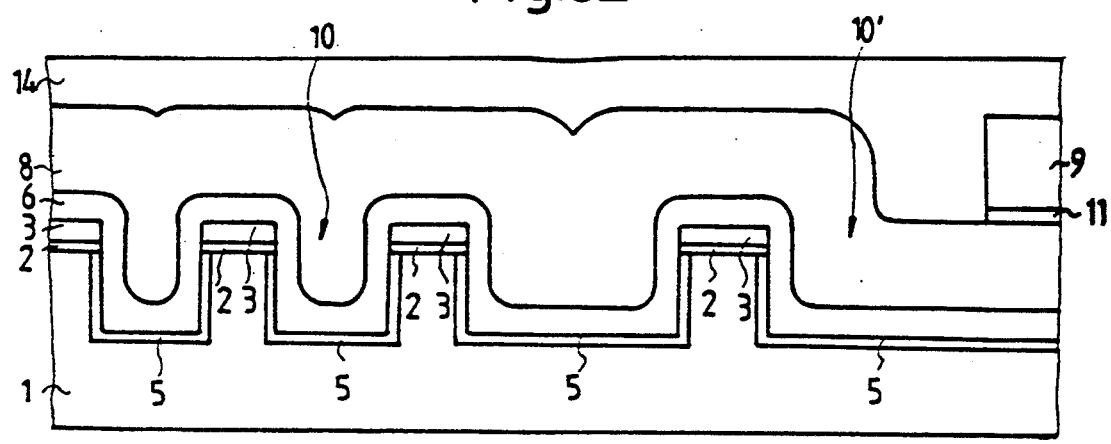

Referring to FIG. 3E, the 2nd polysilicon layer 11 and the 2nd photoresist 12 are eliminated, thereafter, the 3rd photoresist or BPSG(Boron phosphor silicate glass) 14 is flatly coated with 3000–5000Å on the entire structure.

Figure 3F:
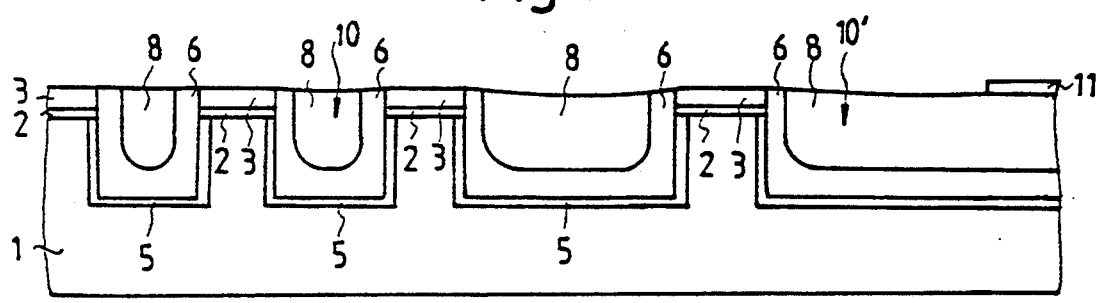

FIG. 3F is a cross sectional view showing the entire structure to be etched until the 2nd polysilicon layer 11 and nitride layer 3 is exposed.

Referring FIG. 3F, the 3rd photoresist or BPSG 14 is performed by blanket etch back until EOP(end of point) signal is detected, thereafter, oxide layer is etched on condition that oxide layer/photoresist or BPSG etch ratio is 1–2.

Oxide material must not remain on the 2nd polysilicon layer 11 and nitride layer 3, performing over etch from the time when EOP signal of polysilicon layer 11 and nitride layer 3 is detected. The 2nd polysilicon layer plays a role of detecting EOP signal and etch barrier when wide trench is overeteched.

Figure 3G:
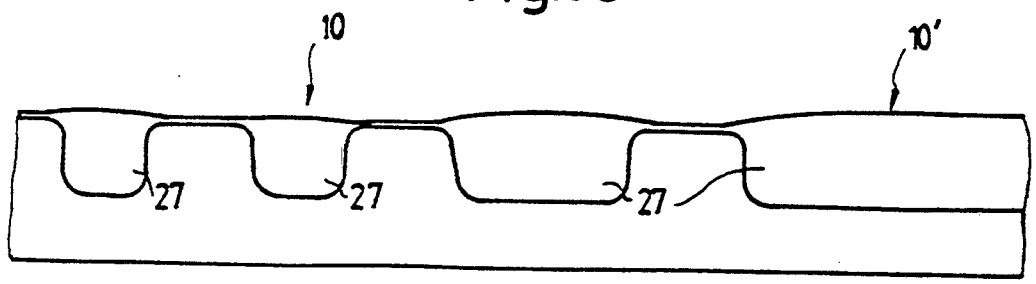

Referring to FIG. 3G, the 2nd polysilicon layer 11 is eliminated by dry etch and nitride layer 3 is eliminated by hot $H_3PO_4$ solution, thereby trench isolation 27 is formed.

The advantages offered by the present invention are mainly-preventing a loss of oxide layer by optionally performing etch barrier when over etch is performed in order to increase uniformity of wafer in wide trench and preventing formation of void in narrow trench and the difference of height between narrow trench and wide trench, thereby preventing a short of conducting line and an increase of a parasitic capacity and a fall of characteristic of MOS transistor.

What is claimed is:

1. A method of manufacturing a trench isolation on a semiconductor substrate, comprising the steps of:

sequentially forming a first oxide layer, a nitride layer and a first photoresist layer on the substrate, forming narrow trenches and wide trenches to have a depth, forming a first thermal oxide layer on the side and bottom face of trenches, forming a second oxide layer to have a depth on the entire structure, depositing a first polysilicon layer to have a depth on the second oxide layer, filling in the trenches by oxidizing the first polysilicon layer to form a second thermal oxide layer, forming a second polysilicon layer on the second thermal oxide to have a depth, forming a third oxide layer to have a thickness extending from the nitride layer to the second thermal oxide layer, on the entire resulting structure, coating a second photoresist on the wide trenches, etching the third oxide layer by using the resulting exposed portion of the second photoresist as etch barrier, eliminating the second polysilicon layer and the second photoresist, flatly coating a third photoresist or BPSG on the entire structure, etching the third photoresist or BPSG, etching the third oxide layer until the second polysilicon layer and nitride layer are exposed, and eliminating the second polysilicon layer of the wide trenches and the nitride layer to form trenches including the first thermal oxide layer and the second thermal oxide layer.

2. A method according claim 1, wherein said trenches are formed with a thickness of 0.4–0.6 μm.

3. A method according claim 1, wherein said second oxide layer is formed with a thickness of 3000–4000Å.

4. A method according claim 1, wherein said first polysilicon layer is formed with a thickness of 500–1000Å.

* * * * *